United States Patent [19]
Lenzini et al.

[11] Patent Number: 5,408,534
[45] Date of Patent: Apr. 18, 1995

[54] ELECTRET MICROPHONE ASSEMBLY, AND METHOD OF MANUFACTURER

[75] Inventors: Ernest L. Lenzini, Elk Grove Village; Timothy K. Wickstrom, Des Plaines, both of Ill.

[73] Assignee: Knowles Electronics, Inc., Itasca, Ill.

[21] Appl. No.: 930,006

[22] Filed: Aug. 13, 1992

Related U.S. Application Data

[63] Continuation-in-part of Ser. No. 847,656, Mar. 5, 1992.

[51] Int. Cl.⁶ .............................................. H04R 25/00
[52] U.S. Cl. ..................................... 381/191; 381/173; 361/787
[58] Field of Search ............... 381/191, 113, 116, 168, 381/173, 174; 310/324; 29/594; 361/787, 789, 772, 774; 439/81, 78, 786, 816

[56] References Cited

U.S. PATENT DOCUMENTS

| | | | |
|---|---|---|---|
| 3,340,440 | 9/1967 | Minter | 361/789 |
| 3,812,575 | 5/1974 | Hedman | 381/191 |
| 3,816,671 | 6/1974 | Fraim et al. | 381/173 |
| 3,864,531 | 2/1975 | Watson | 381/173 |
| 3,946,422 | 3/1976 | Yagi et al. | 381/191 |
| 3,949,178 | 4/1976 | Hellström et al. | 381/191 |
| 4,014,091 | 3/1977 | Kodera et al. | 381/191 |
| 4,151,480 | 4/1979 | Carlson et al. | 330/277 |
| 4,636,768 | 1/1987 | Hagen | 338/312 |
| 4,701,640 | 10/1987 | Flygstad et al. | 381/173 |
| 4,764,690 | 8/1988 | Murphy et al. | 307/400 |
| 4,828,515 | 4/1989 | Senor et al. | 439/862 |
| 4,890,329 | 12/1989 | Erbe | 381/68.7 |
| 4,941,180 | 7/1990 | Buettner | 381/69.2 |
| 4,947,439 | 8/1990 | Buettner | 381/69.2 |
| 5,004,317 | 4/1991 | Jackson et al. | 350/96.2 |
| 5,041,016 | 8/1991 | Machado et al. | 439/502 |

FOREIGN PATENT DOCUMENTS

| | | | |
|---|---|---|---|
| 0194958 | 9/1986 | European Pat. Off. | |
| 3325966 | 7/1983 | Germany | |
| 0038735 | 3/1980 | Japan | 381/191 |
| 0625276 | 9/1978 | U.S.S.R. | 439/816 |

Primary Examiner—Curtis Kuntz
Assistant Examiner—Huyen D. Le
Attorney, Agent, or Firm—Wallenstein & Wagner, Ltd.

[57] ABSTRACT

An electret microphone assembly, such as for a hearing aid comprises an electret microphone having a diaphragm and a charged plate, a substrate spaced from the charged plate, and a wire loop having first and second ends and a mid-portion. The first and second ends are secured to the substrate and the mid-portion is pressed against the charged plate. An amplifier is disposed on the substrate and has an input terminal coupled to the wire loop. Alternatively, an impedance matching circuit can be disposed on the substrate and coupled to the wire loop. A conductive bond containing silver particles further secures the wire loop mid-portion and the charged plate. In an alternative configuration the loop is dimensioned such that its mid-portion passes close to the charged plate without touching it. The conductive bond serves not only to form a rigid structure, but also serves as an electrical bridge to complete the circuit between the two elements. The first and second ends are wedge-bonded to the substrate, and the wire loop forms an angle of substantially 90° with the substrate. A conductive track disposed on the substrate coupling the first and second ends. A method of manufacturing the electret microphone assembly is also disclosed.

20 Claims, 2 Drawing Sheets

ELECTRET MICROPHONE ASSEMBLY, AND METHOD OF MANUFACTURER

This application is a continuation-in part of application Ser. No. 07/847,656, filed Mar. 5, 1992.

TECHNICAL FIELD

Applicants' invention relates to an electret microphone assembly having a charged plate coupled to a substrate, such as for a hearing aid, and to a method of manufacturing the assembly. More particularly, the invention relates to the connection of the charged plate to the substrate.

RELATED APPLICATIONS

This application is related to commonly assigned U.S. Pat. No. 5,083,095, entitled "Plural Source Follower Amplifier", the specification of which is expressly incorporated herein.

BACKGROUND PRIOR ART

Electret microphone assemblies are well known in the art. Typically, the assemblies include an electret microphone disposed within a housing. The electret microphone has a diaphragm and a charged plate. Sound vibration vibrates the diaphragm, which vibration generates an electrical signal on the charged plate. Often the housing also contains a substrate. The substrate can support an impedance matching circuit for matching the high impedance of the electret microphone with the relatively lower input impedance of an external amplifier. Alternatively, the substrate can support an internal amplifier, such as that disclosed in the above-incorporated patent.

In either event, the impedance matching circuit and the internal amplifier each have an input terminal which must be coupled to the charged plate. Because of the extremely small dimensions of such microphones, especially as used in hearing aids, coupling the charged plate to the particular input terminal has been difficult.

Applicants' invention is provided to solve this and other problems.

SUMMARY OF THE INVENTION

It is an object of the invention to provide an electret microphone assembly, such as for a hearing aid.

In accordance with the invention, the assembly comprises an electret microphone having a diaphragm and a charged plate, a substrate spaced from the charged plate, and a wire loop having first and second ends and a mid-portion. The first and second ends are secured to the substrate and the mid-portion is pressed against the charged plate.

It is comprehended that an amplifier or impedance matching circuit can be disposed on the substrate. The amplifier or impedance matching circuit each have a respective input terminal coupled to the wire loop.

It is further comprehended that a conductive epoxy bond containing silver particles further secures the wire loop mid-portion to the charged plate.

It is further comprehended that the wire loop is configured with a radius chosen such that the mid-portion of the loop can pass close to the charged plate without contacting it, and that a conductive epoxy bond bridges the gap between the two elements as a conducting member to conductively secure them together.

It is still further comprehended that the first and second ends are wedge-bonded to the substrate, and that the wire loop forms an angle of substantially 90° with the substrate. A conductive track disposed on the substrate couples the first and second ends.

It is another object of the invention to provide a method of manufacturing the electret microphone assembly.

In accordance with this aspect of the invention, the method comprises providing a substrate, providing a wire loop having first and second ends and a mid-portion, and securing said first and second ends to said substrate. The method further comprises providing an electret microphone having a diaphragm and a charged plate and disposing said electret microphone in spaced relationship with said substrate such that said mid-portion is pressed against said charged plate. An alternative method comprises providing the wire loop of radius sufficiently short that the mid-portion thereof attaches close to the charged plate without contacting it. A drop of a conductive adhesive, such as a conductive epoxy or a conductive plastic, bridges the gap as a conducting member to adheringly conductingly secure the two elements together.

Other features and advantages of the invention will be apparent from the following specification taken in conjunction with the following drawings.

DESCRIPTION OF THE PREFERRED EMBODIMENT

Figure 1:
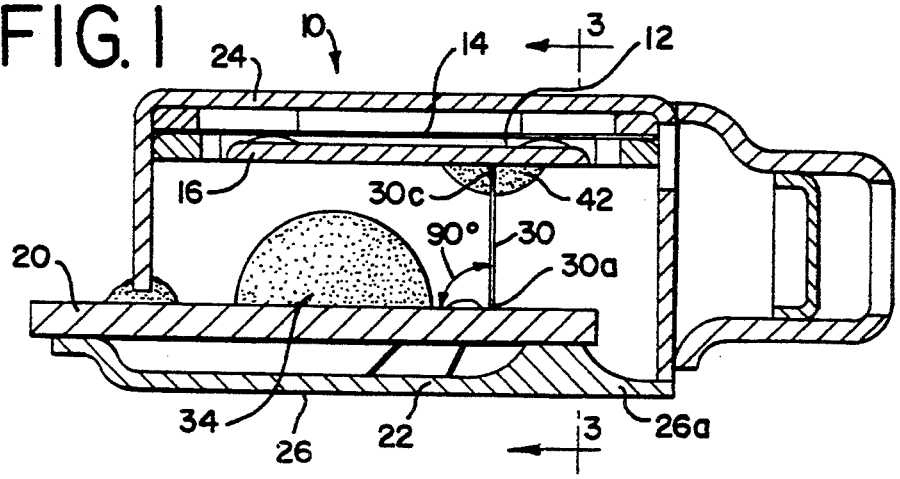
FIG. 1 is a side view of an electret microphone assembly according to the invention.

While this invention is susceptible of embodiments in many different forms, there is shown in the drawings and will herein be described in detail, preferred embodiments of the invention with the understanding that the present disclosure is to be considered as an exemplification of the principles of the invention and is not intended to limit the broad aspects of the invention to the particular embodiments illustrated.

Figure 2:
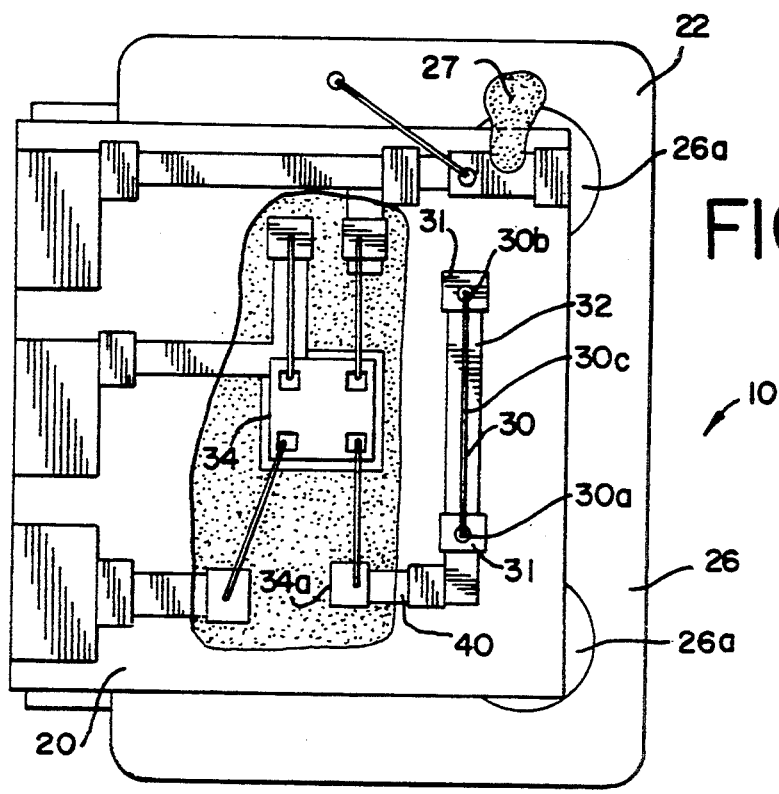
FIG. 2 is a plan view of the electret microphone assembly of FIG. 1.
Figure 3:
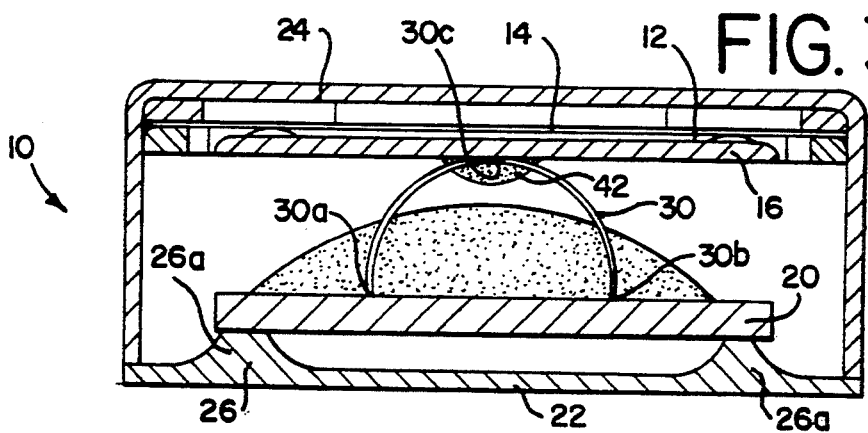
FIG. 3 is a sectional view of the electret microphone assembly taken along line 3—3 of FIG. 1.

An electret microphone assembly, generally designated 10, is illustrated in FIGS. 1-3.

The electret microphone assembly 10 comprises a conventional electret microphone 12 having a diaphragm 14 and a charged plate 16. The operation of the electret microphone assembly 10 is well known in the art and, therefore, will not be further discussed.

The electret microphone assembly 10 further comprises a substrate 20, such as ceramic, spaced a first distance of 0.0425" from the charged plate 16. A housing 22 comprises a first, or upper, housing piece 24 and a second, or lower, housing piece 26, which are attached via a conventional laser seam weld. The first housing piece 24 supports the microphone 12. The second housing piece 26 supports the substrate 20 via bosses 26a. The substrate 20 is secured to the bosses 26a via conductive epoxy 27. The epoxy 27 further provides a redundant short to case ground. A wire 30, such as 0.002" diameter gold wire, has a first end 30a and a second end 30b secured to conductive pads 31 on the substrate 20. The conductive pads 31 are interconnected via a conductive strip 32. The wire 30 has a mid- or distal-portion 30c disposed at an angle of substantially 90° relative to the substrate 20. The mid- or distal-portion 30c extends away from the substrate 20 a distance of 0.0450", which is greater than the distance between the charged plate 16 and the substrate 20. Thus, when the first housing piece 24 is connected to the second housing piece 26, the wire mid- or distal-portion 30c is advantageously pressed into contact with the charged plate 16.

Alternatively, the wire 30 could be reversed, such that the wire first and second ends 30a, 30b, could be attached to the charged plate 16 and the wire mid- or distal-portion 30c is pressed into contact with the conductive strip 32.

The method further comprises the steps of providing the electret microphone 12 having the diaphragm 14 and the charged plate 16, and attaching the electret microphone 12 to the second housing piece 26. The first housing piece 24 is then attached to the second housing piece 26, such that the substrate 20 is disposed the second distance away from the charged plate 16. The first distance is greater than the second distance. Thus when the first housing piece 24 is attached to the second housing piece 26, the wire mid- or distal-portion 30c is pressed into contact with the charged plate 16. Prior to attaching the first housing piece 24 to the second housing piece 26, a conductive adhesive 42, such as a conductive epoxy or a conductive plastic, is placed on the charged plate at the intended point of contact between the wire 30 and the charged plate 16. After attaching the first housing piece 24 to the second housing piece 26, the conductive adhesive 42 hardens, bonding the wire 30 to the charged plate 16. The method can similarly be incorporated using the wire 30 with only one wire end attached to the substrate. Further, the method can be incorporated, such that the wire 30 is reversed, with the wire end, or ends, attached to the charged plate 16, and the mid- or distal-portion 30c pressed into contact with the substrate 20.

Figure 4:
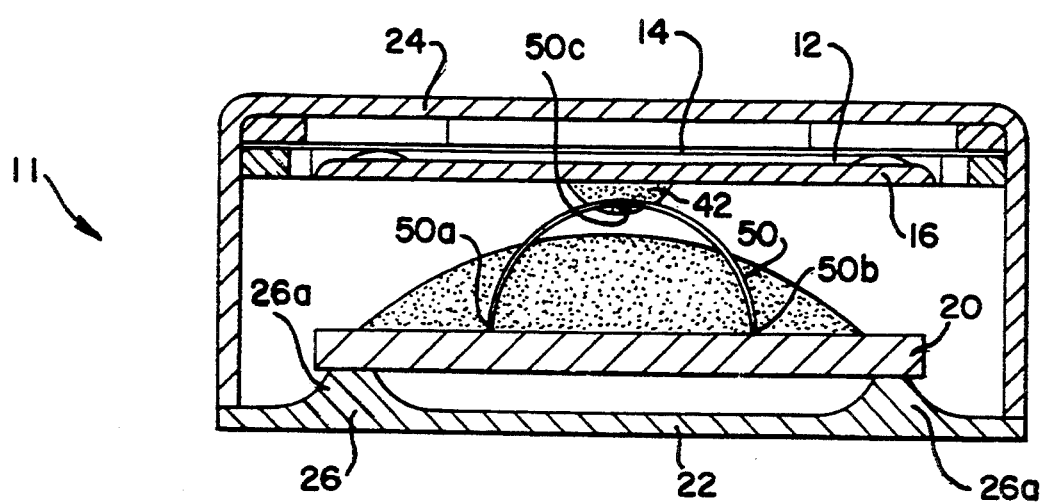
FIG. 4 is a sectional view of an alternative form of the electret microphone assembly shown in FIG. 3.

An alternative method produces an electret microphone assembly 11 as shown in FIG. 4 where the wire 50 is configured with a smaller radius such that its mid- or distal-portion 50c passes close to the charged plate 16 without physically contacting it. The conductive adhesive 42 spans the standoff distance between the wire 50 and the charged plate 16, and upon hardening forms a rigid conducting bridge completing the structure. As shown in FIG. 4, the wire ends 50a, 50b are attached to the substrate 20; however, the wire 50 may similarly be reversed as set forth above.

A circuit 34, such as an amplifier or an impedance matching circuit, having an input terminal 34a is supported on the substrate 20, and the wire 30 is coupled to the input terminal 34a by an extension 40 of the conductive strip 32 conventionally printed and baked on the substrate 20.

The conductive adhesive 42 is preferably an epoxy containing silver particles which permanently bonds the wire 30 to the charged plate 16.

Although the wire ends 30a, 30b can be ball-bonded to the substrate 20, in the preferred embodiment, they are wedge-bonded, such as by using the Model-1100 Ultrasonic Stitchbonder, sold by Engineered Machine Builders of Mountain View, Calif. 90041. The wedge-bonder first attaches the first wire end 30a to a first one of the conductive pads 31 with a heated chuck. The wedge-bonder then feeds additional wire as it moves toward the second one of the conductive pads 31. The wedge-bonder attaches the wire second end 30b to the second one of the conductive pads 31 and cuts the wire 30 to the proper length. Thus, the wire 30 is accurately aligned between the conductive pads 31, and the mid- or distal-portion 30c is accurately positioned at the proper distance from the substrate 20. It has been found that wedge-bonding more accurately orients the wire 30 relative to the substrate 20 and the charged plate 16, such that the wire loop forms an angle of substantially 90° with the substrate 20.

Alternatively, the wire 30 can have only one end such as wire end 30a, attached to the substrate 20. This alternative embodiment requires less space, but it is more difficult to align the wire 30 with respect to the charged plate 16.

It is a further aspect of the invention to provide a method of assembling the electret microphone assembly 10.

The method comprises the steps of providing the housing 22 comprising the first housing piece 24 and the second housing piece 26 and attaching the substrate 20 to the first housing piece 24. The wire 30 has the first and second ends 30a, 30b, and the mid- or distal portion 30c extends the first distance away from the substrate 20.

The method further comprises the steps of providing the electret microphone 12 having the diaphragm 14 and the charged plate 16, and attaching the electret microphone 12 to the second housing piece 26. The first housing piece 24 is then attached to the second housing piece 26, such that the substrate 20 is disposed the second distance away from the charged plate 16. The first distance is greater than the second distance. Thus when the first housing piece 24 is attached to the second housing piece 26, the wire mid- or distal-portion 30c is pressed into contact with the charged plate 16. Prior to attaching the first housing piece 24 to the second housing piece 26, the conductive adhesive 42 is placed on the charged plate at the intended point of contact between the wire 30 and the charged plate 16. After attaching the first housing piece 24 to the second housing piece 26, the conductive adhesive 42 hardens, bonding the wire 30 to the charged plate 16. The method can similarly be incorporated using the wire 30 with only one wire end attached to the substrate. Further, the method can be incorporated, such that the wire 30 is reversed, with the wire end, or ends, attached to the charged plate 16, and the mid- or distal-portion 30c pressed into contact with the substrate 20.

An alternative method produces an electret microphone assembly 11 as shown in FIG. 4 where the wire 50 is configured with a smaller radius such that its mid- or distal-portion 50c passes close to the charged plate 16 without physically contacting it. The conductive adhesive 42 spans the standoff distance between the wire 50 and the charged plate 16, and upon hardening forms a rigid conducting bridge completing the structure. As shown in FIG. 4, the wire ends 50a, 50b are attached to the substrate 20; however, the wire 50 may similarly be reversed as set forth above.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. An electret microphone assembly comprising:
   an electret microphone having a diaphragm and a charged plate, said charged plate presenting a generally planar charged plate surface;
   a substrate spaced from said charged plate, said substrate presenting a generally planar substrate surface;
   a wire loop having a first end, a second end and a portion intermediate said first and second ends which define a convex surface, wherein said first and second ends are secured to one of said substrate and said charged plate, and said convex surface is in confrontation with said generally planar surface of said other of said substrate and said charged plate; and
   contacting means for forming an electrical contact between said convex surface and said other of said substrate and said charged plate, such that said wire loop forms such electrical contact without particular alignment of said wire loop with said generally planar surface.

2. The assembly of claim 1 wherein said convex surface is affixed to said other of said substrate and said charged plate by means of a quantity of hardened conductive adhesive.

3. The assembly of claim 4 wherein said conductive adhesive comprises conductive epoxy.

4. The assembly of claim 4 wherein said conductive adhesive comprises conductive plastic.

5. The assembly of claim 1 wherein said convex surface is proximate to and out of contact with said other of said substrate and said charged plate, and said contacting means includes a hardened conducting plastic bond element joining said convex surface and said other of said substrate and said charged plate.

6. A method of manufacturing an electret microphone assembly comprising:
   providing a substrate, said substrate presenting a generally planar substrate surface;
   providing a wire loop having first and second ends and an intermediate-portion which define a convex surface;
   providing an electret microphone having a diaphragm and a charged plate, said charged plate presenting generally planar charged plate surface;
   securing said first and second ends to said generally planar surface of one of said substrate and said charged plate so that said convex surface extends a first distance away from said surface of said one of said substrate and said charged plate;
   disposing said electret microphone in spaced relationship with said substrate such that said convex surface is in confrontation with said generally planar surface of the other of said substrate and said charged plate; and
   forming an electrical connection between said convex surface and said generally planar surface, such that said wire loop forms such electrical contact without particular alignment of said wire loop with said generally planar surface.

7. The method of claim 6 including the step of configuring said convex surface to be in pressing contacting engagement with said other of said substrate and said charged plate.

8. The method of claim 7 including the steps of providing a quantity of hardenable conductive adhesive; affixing said convex surface to said other of said substrate and said charged plate by means of a quantity of said hardenable conductive adhesive; and causing said conductive adhesive to harden.

9. The method of claim 6 including the steps of configuring said convex surface to be proximate to and out of contact with said other of said substrate and said charged plate; providing a quantity of hardenable conductive adhesive; disposing a quantity of said adhesive to form a bridge between said convex surface and said other of said substrate and said charged plate; and causing said adhesive bridge to harden.

10. An electret microphone assembly comprising:
    an electret microphone having a diaphragm and a charged plate, said charged plate presenting a generally planar charged plate surface;
    a substrate spaced from said charged plate, said substrate presenting a generally planar substrate surface; and
    a wire loop having a first end and a second end, and a portion intermediate said first and second ends, wherein said first and second ends are secured to said planar surface of one of said substrate and said charged plate, and said first end, said second end and said intermediate portion define a convex surface pressed against said generally planar surface of the other of said substrate and said charged plate, such that said wire loop forms such electrical contact without particular alignment of said wire loop with said generally planar surface.

11. The assembly of claim 10 including:
    an amplifier having an input terminal; and
    means for coupling said wire loop to said input terminal.

12. The assembly of claim 10 including:
    a impedance matching circuit having an input terminal; and
    means for coupling said wire loop to said input terminal.

13. The assembly of claim 10 including an adhesive bond between said wire loop convex surface and said charged plate.

14. The assembly of claim 13 wherein said adhesive bond comprises epoxy.

15. The assembly of claim 13 wherein said adhesive bond comprises plastic.

16. The assembly of claim 10 wherein said adhesive bond is conductive.

17. The assembly of claim 16 wherein said adhesive bond includes silver particles.

18. The assembly of claim 10 wherein said first and second ends are wedge-bonded to said substrate.

19. The assembly of claim 10 wherein said wire loop forms an angle of substantially 90° with said substrate.

20. The assembly of claim 10 including a conductive track disposed on said substrate for coupling said first and second ends.

* * * * *

UNITED STATES PATENT AND TRADEMARK OFFICE
CERTIFICATE OF CORRECTION

PATENT NO. : 5,408,534
DATED : April 18, 1995
INVENTOR(S) : Ernest L. Lenzini and Timothy K. Wickstrom It is certified that error appears in the above-indentified patent and that said Letters Patent is hereby corrected as shown below:

At Column 5, line 29, please delete "4" and insert --2--.

At Column 5, line 31, please delete "4" and insert --2--.

Signed and Sealed this

Nineteenth Day of September, 1995

*Attest:*

BRUCE LEHMAN

*Attesting Officer*  *Commissioner of Patents and Trademarks*